United States Patent
Tristano et al.

(10) Patent No.: US 10,573,070 B1
(45) Date of Patent: Feb. 25, 2020

(54) SYSTEMS AND METHODS FOR GENERATING A SURFACE THAT APPROXIMATES ONE OR MORE CAD SURFACES

(71) Applicant: Ansys, Inc., Canonsburg, PA (US)

(72) Inventors: Joseph Tristano, Tega Cay, SC (US); Gilles Venet, Chassieu (FR)

(73) Assignee: ANSYS, Inc., Canonsburg, PA (US)

( * ) Notice: Subject to any disclaimer, the term of this patent is extended or adjusted under 35 U.S.C. 154(b) by 0 days.

(21) Appl. No.: 15/281,513

(22) Filed: Sep. 30, 2016

Related U.S. Application Data

(60) Provisional application No. 62/236,402, filed on Oct. 2, 2015.

(51) Int. Cl.
G06T 17/20 (2006.01)
G06F 17/50 (2006.01)

(52) U.S. Cl.
CPC ............ G06T 17/20 (2013.01); G06F 17/50 (2013.01)

(58) Field of Classification Search
CPC .................... G06T 17/20; G06T 17/50
See application file for complete search history.

(56) References Cited

U.S. PATENT DOCUMENTS

| | | | |
|---|---|---|---|
| 6,307,555 B1 * | 10/2001 | Lee | G06T 17/20 345/421 |
| 6,342,886 B1 * | 1/2002 | Pfister | G06T 13/20 345/419 |
| 6,356,263 B2 * | 3/2002 | Migdal | G06T 17/20 345/421 |
| 6,940,505 B1 * | 9/2005 | Savine | G06T 17/20 345/419 |
| 7,212,197 B1 * | 5/2007 | Schkolne | G06T 19/20 345/419 |
| 2002/0167518 A1 * | 11/2002 | Migdal | G06T 17/20 345/428 |
| 2007/0088531 A1 * | 4/2007 | Yuan | G06T 17/20 703/2 |
| 2010/0094597 A1 * | 4/2010 | Blain | G06T 17/20 703/1 |
| 2011/0316854 A1 * | 12/2011 | Vandrovec | G06T 17/005 345/420 |
| 2012/0206457 A1 * | 8/2012 | Crocker | G06T 17/10 345/420 |
| 2013/0002670 A1 * | 1/2013 | Kikuta | G06T 15/04 345/420 |
| 2014/0184599 A1 * | 7/2014 | Quilot | G06T 17/20 345/423 |

\* cited by examiner

Primary Examiner — Michael Le
(74) Attorney, Agent, or Firm — Jones Day

(57) ABSTRACT

Systems and methods are provided for generating a surface that approximates one or more CAD surfaces. An input that approximates the one or more CAD surfaces via a plurality of triangles is received. A mesh of equilateral triangles is generated on the input, with the mesh including vertices that lie on the input. Vertices of the mesh are moved to generate a control mesh, the control mesh having a corresponding limit surface that passes through all of the vertices of the mesh. A local refinement is performed on one or more regions of the control mesh that have an error that is greater than a threshold value, where the local refinement causes the limit surface of the control mesh to more closely approximate the one or more CAD surfaces. The mesh is parameterized to generate a two-dimensional (2D) representation of the mesh.

22 Claims, 19 Drawing Sheets

SYSTEMS AND METHODS FOR GENERATING A SURFACE THAT APPROXIMATES ONE OR MORE CAD SURFACES

CROSS-REFERENCE TO RELATED APPLICATIONS

This application claims priority to U.S. Provisional Patent Application No. 62/236,402, filed Oct. 2, 2015, entitled "Systems and Methods for Generating a Surface that Approximates One or More CAD Surfaces," which is incorporated herein by reference in its entirety.

FIELD

This disclosure is related generally to computer-aided design and more particularly to systems and methods for generating a surface that approximates one or more computer aided design (CAD) surfaces.

BACKGROUND

Subdivision surfaces are polygon mesh surfaces generated from a control mesh via an iterative process that refines the mesh based on templates. The limit surface corresponding to the control mesh represents a smooth surface. After a number of iterations in which the control mesh is refined, the resulting mesh approaches the limit surface. A distinction is made between "interpolating" subdivision schemes and "approximating" subdivision schemes. In interpolating schemes, after subdivision, control points of the original mesh and the newly-generated points are interpolated based on the existing points. In approximating schemes, the limit surfaces approximate the control mesh, and after subdivision, the newly-generated points are not in the control mesh.

SUMMARY

Systems, methods, and non-transitory computer-readable storage mediums are provided for generating a surface that approximates one or more computer aided design (CAD) surfaces. In an example computer-implemented method, an input that approximates the one or more CAD surfaces via a plurality of triangles is received. A mesh of equilateral triangles is generated on the input, with the mesh including vertices that lie on the input. Vertices of the mesh are moved to generate a control mesh, the control mesh having a corresponding limit surface that passes through all of the vertices of the mesh. A local refinement is performed on one or more regions of the control mesh that have an error that is greater than a threshold value, where the local refinement causes the limit surface of the control mesh to more closely approximate the one or more CAD surfaces. The mesh is parameterized to generate a two-dimensional (2D) representation of the mesh.

An example computer-implemented system for generating a surface that approximates one or more CAD surfaces includes a processing system and a memory in communication with the processing system. The processing system is configured to execute steps. In executing the steps, an input that approximates the one or more CAD surfaces via a plurality of triangles is received. A mesh of equilateral triangles is generated on the input, with the mesh including vertices that lie on the input. Vertices of the mesh are moved to generate a control mesh, the control mesh having a corresponding limit surface that passes through all of the vertices of the mesh. A local refinement is performed on one or more regions of the control mesh that have an error that is greater than a threshold value, where the local refinement causes the limit surface of the control mesh to more closely approximate the one or more CAD surfaces. The mesh is parameterized to generate a 2D representation of the mesh.

An example non-transitory computer-readable storage medium for generating a surface that approximates one or more CAD surfaces includes computer-executable instructions which, when executed, cause a processing system to execute steps. In executing the steps, an input that approximates the one or more CAD surfaces via a plurality of triangles is received. A mesh of equilateral triangles is generated on the input, with the mesh including vertices that lie on the input. Vertices of the mesh are moved to generate a control mesh, the control mesh having a corresponding limit surface that passes through all of the vertices of the mesh. A local refinement is performed on one or more regions of the control mesh that have an error that is greater than a threshold value, where the local refinement causes the limit surface of the control mesh to more closely approximate the one or more CAD surfaces. The mesh is parameterized to generate a 2D representation of the mesh.

BRIEF DESCRIPTION OF THE DRAWINGS

FIG. 3I depicts an addition of equilateral triangles to the boundary of the modified mesh of FIG. 3H to form a second modified mesh, the second modified mesh extending beyond the boundary of the input tessellation.

DETAILED DESCRIPTION

Figure 1:
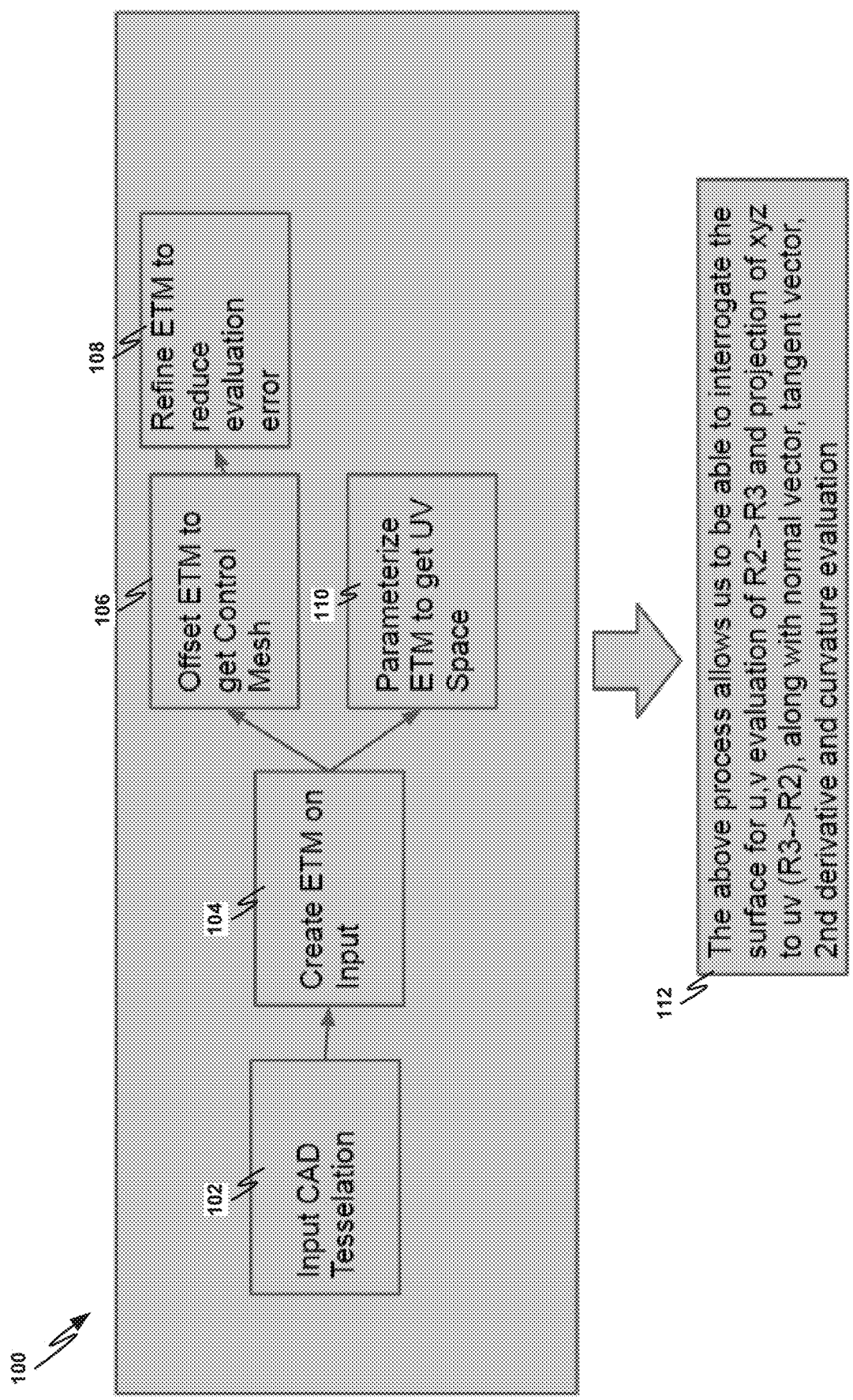
FIG. 1 depicts a flowchart including example steps of a method for generating a surface that approximates one or more computer-aided design (CAD) surfaces.

FIG. 1 depicts a flowchart including example steps of a method for generating a surface that approximates one or more computer-aided design (CAD) surfaces. CAD-based modeling techniques are used in a variety of fields (e.g., vehicle design, endoscopic surgery, etc.). When CAD-based modeling techniques are used, modeling applications communicate with an underlying CAD kernel (e.g., through vendor-provided CAD interfaces, vendor-neutral interfaces, etc.). Although the use of CAD-based approaches may be attractive in some situations, CAD-based approaches may be undesirable or not feasible in other situations. Examples of such situations are described in Per-Olof Persson, et al., "On the Use of Loop Subdivision Surfaces for Surrogate Geometry," Proceedings of the 15th International Meshing Roundtable 2006, pages 375-392, which is incorporated herein by reference in its entirety.

In situations where CAD-based modeling is not used, a CAD-free surrogate may be required. The CAD-free surrogate may be used for the queries that the CAD system usually handles in CAD-based approaches. As described below, in the systems and methods described herein, Loop subdivision surfaces are used as a surrogate for one or more CAD surfaces. Subdivision surfaces (including the specific Loop subdivision surfaces utilized herein) are becoming increasingly popular, e.g., because of their ability to represent any shape with only one surface. A subdivision surface is generated by repeatedly refining a control mesh to obtain a limit surface. Additional details on subdivision surfaces are described in the aforementioned reference by Persson, et al.

As noted above, Loop subdivision surfaces are defined by a control mesh. In the systems and methods described herein, the control mesh is generated based on an equilateral triangle mesh. The equilateral triangle mesh is composed entirely of equilateral triangles, as described in further detail below. The use of an equilateral triangle mesh in generating the control mesh is in contrast to conventional approaches, which do not use such equilateral triangle meshes. In examples, the use of the equilateral triangle mesh permits a large percentage of vertices of the resulting control mesh to be connected to exactly six (6) triangles (e.g., to have a valence of six). It is noted that not all of the equilateral triangle mesh has a valence of six, but nodes having a valence of six allow for exact evaluation of the limit surface for the given set of triangles. To illustrate aspects of the systems and methods described herein utilizing the equilateral triangle mesh, reference is made to FIG. 1. This figure illustrates example steps for generating a surface that approximates one or more CAD surfaces, as noted above.

At 102, an input approximating one or more CAD surfaces via a plurality of triangles is received. Although the description below describes an embodiment in which the input comprises a tessellation of the one or more CAD surfaces, it is noted that in other embodiments, the input comprises a mesh. In general, a tessellation process is a process of decomposing a surface (e.g., the one or more CAD surfaces) into more simple primitives, such as triangles or quadrilaterals. Tessellation processes are known to those of ordinary skill in the art. In the systems and methods described herein, the tessellation received at 102 is composed of triangle primitives, and thus, the tessellation approximates the one or more CAD surfaces via a plurality of triangles. At 104, a mesh $M^0$ of equilateral triangles is generated on the tessellation. The mesh $M^0$ of equilateral triangles (also referred to herein as an equilateral triangle mesh or "ETM") includes vertices that lie directly on the tessellation. As described in further detail below, the generation of a control mesh $\overline{M}$ using the equilateral triangle mesh $M^0$ includes moving vertices of the mesh $M^0$ off of the tessellation. The generation of the equilateral triangle mesh $M^0$ is described below with reference to FIGS. 3A-4. In an example, the equilateral triangle mesh is generated in a manner that causes the mesh to hang over an exterior boundary of the tessellation, i.e., the equilateral triangle mesh extends an incremental, finite distance away from the exterior boundary of the tessellation. The use of the equilateral triangle mesh to generate the control mesh and the particular method by which the equilateral triangle mesh is generated, as described herein, are both in contrast to conventional methods.

At 106, the equilateral triangle mesh $M^0$ is offset to generate the control mesh $\overline{M}$. More specifically, in an example, vertices of the equilateral triangle mesh $M^0$ are moved to generate the control mesh $\overline{M}$, with the control mesh $\overline{M}$ having a corresponding limit surface $M^\infty$ that passes through all of the vertices of the mesh $M^0$. A subdivision surface is generated by repeatedly refining the control mesh to get a limit surface (i.e., the surface after infinitely many subdivisions steps is the limit surface). In examples, the limit surface $M^\infty$ of the control mesh $\overline{M}$ has a C2 continuity, where the C2 continuity allows for a continuous first and second derivative. The subdivision surface is determined by the way in which the control mesh is refined (i.e., the subdivision scheme). The systems and methods described herein utilize an approximating subdivision scheme in which the limit surface does not interpolate the given control mesh. Approximating subdivision schemes are in contrast to interpolating schemes. In interpolating schemes, the limit surface interpolates the given control mesh. The Loop subdivision scheme, as described in Charles Loop, "Smooth Subdivision Surfaces Based on Triangles" (Master's Thesis), Dept. Math., Univ. Utah, 1987, which is incorporated herein by reference in its entirety, is an approximating scheme utilized in the systems and methods described herein.

Although subdivision surfaces generated by the Loop subdivision scheme do not interpolate their control meshes, it is possible to use this approach to generate a subdivision surface to interpolate the vertices of a given mesh. Thus, as described below, vertices of the equilateral triangle mesh $M^0$ are moved to generate the control mesh, where the control mesh has a corresponding limit surface $M^\infty$ that passes through all of the vertices of the equilateral triangle mesh $M^0$. Specifically, to interpolate the vertices of the equilateral triangle mesh $M^0$ with a Loop subdivision surface, a closed control mesh $\overline{M}$ whose Loop surface passes through all the vertices of the equilateral triangle mesh $M^0$ is determined. In an example, the control mesh $\overline{M}$ is determined via an iterative process. In the iterative process, the limit surface $M^\infty$ is first considered. For each vertex $V^0$ of $M^0$, the distance between this vertex and its limit point $V_\infty^0$ on the limit surface $M^\infty$ is determined via a first equation $$D^0 = V^0 - V_\infty^0.$$

The distance $D^0$ is added to the vertex $V^0$ to determine a new vertex $V^1$ via a second equation $$V^1 = V^0 + D^0.$$

A set of all of the new vertices is a mesh $M^1$. The mesh $M^1$ has a Loop surface $S^1$. The Loop surface $S^1$ of $M^1$ is considered, and the steps above are repeated. In general, if $V^k$ is the new location of $V^0$ after k iterations of the above process, and $M^k$ is the set of all the new $V^k$'s with a Loop surface $S^k$, the distance between $V^0$ and the limit point $V_\infty^0$ of $V^k$ on $S^k$ is computed via a third equation:

$$D^k = V^0 - V_\infty^k.$$

The distance $D^k$ is added to $V^k$ to get $V^{k+1}$ via a fourth equation:

$$V^{k+1} = V^k + D^k.$$

The set of new vertices is called $M^{k+1}$. The process generates multiple control meshes $M^k$ and multiple corresponding Loop surfaces $S^k$. $S^k$ converges to an interpolating surface of $M^0$ if the distance between $S^k$ and $M^0$ converges to zero (i.e., $D^k$ converges to zero when k tends to infinity). Additional details on the moving of vertices of the mesh $M^0$ to generate the control mesh $\overline{M}$, where the control mesh $\overline{M}$ has a corresponding limit surface that passes through all of the vertices of the mesh $M^0$, is described in Fu-Hua Cheng et al., "Loop Subdivision Surface Based Progressive Interpolation," Journal of Computer Science and Technology 24(1): 39-46, January 2009, which is incorporated herein by reference in its entirety.

At 108, the equilateral triangle mesh $M^0$ is refined to reduce an evaluation error. Specifically, in an example, a local refinement is performed on one or more regions of the control mesh $\overline{M}$ that have an error that is greater than a threshold value. The local refinement is performed on local regions of the control mesh and is not a global refinement of the entire control mesh. The local refinement causes the limit surface of the control mesh $\overline{M}$ to more closely approximate the one or more CAD surfaces. Refinement processes are described in greater detail below with reference to FIGS. 5A-6C.

At 110, the equilateral triangle mesh $M^0$ is parameterized to generate a two-dimensional (2D) representation of the mesh $M^0$. The 2D representation of the mesh $M^0$ may be referred to herein as a "UV space," as indicated in FIG. 1. Parameterizing a 3D mesh includes computing a correspondence between a discrete surface patch and an isomorphic planar mesh through a piecewise linear function (i.e., mapping). In examples, this piecewise linear mapping is defined by assigning each mesh vertex (i.e., node) a pair of coordinates (u, v) referencing to its position on the planar region. The one-to-one mapping provides a flat parametric space, allowing for the performing of complex operations directly on the flat domain rather than on the curved surface. This may facilitate various mesh processing (e.g., surface fitting, remeshing, texture mapping, etc.). Parameterization is known to those of ordinary skill in the art and is described in (i) Mathieu Desbrun et al., "Intrinsic Parameterizations of Surface Meshes," Eurographics 2002, Volume 21, Number 2, and (ii) Kai Hormann et al., "MIPS: An Efficient Global Parameterization Method," Curve and Surface Design (Saint-Malo 1999), which are incorporated herein by reference in their entireties.

As indicated at 112, the performing of the steps 102, 104, 106, 108, 110 permits an evaluation procedure and/or projection procedure to be performed. In an example, the evaluation or projection procedure includes (i) determining a point in three-dimensional (3D) space that corresponds to a point on the 2D representation, (ii) determining a closest perpendicular point on the limit surface from a given 3D point in space, and (iii) determining first and second derivative values, curvature values, and other standard surface evaluations. In examples, a highest quality evaluation is obtained by having a maximum amount of regular connectivity (six facets connected at a node) in the control mesh. The maximum amount of regular connectivity may be achieved by the control mesh having a maximum number of equilateral triangles. Further, to reduce an amount of time necessary for performing the evaluation, the number of subdivisions of the control mesh should be minimized. This may be done by having a maximum amount of regular connectivity (six facets connected at a node) in the control mesh, which may be achieved by the control mesh having a maximum number of equilateral triangles. It is thus noted that the considerations regarding quality of evaluation and time of evaluation may converge to a single principle: the control mesh should be built with equilateral triangles to maximize the number of nodes with six connections, thus maximizing the quality of the evaluation.

The use of the techniques described herein (e.g., using Loop projection, using an equilateral triangle mesh in generating the control mesh, etc.) improves the functioning of a computer system as compared to the conventional approaches because the techniques described herein permit generation of a surface that approximates one or more CAD surfaces in a manner that is more efficient (e.g., faster, with smaller memory requirements, etc.) and/or has a reduced processing burden as versus the conventional approaches. It is further noted that the techniques described herein improve the functioning of the computer system without sacrificing accuracy in the determination of the surface. In some instances, the techniques of the instant application enable a better quality result (e.g., a surface that more accurately approximates the one or more CAD surfaces) to be obtained in less time, as compared to the conventional approaches.

Figure 2:
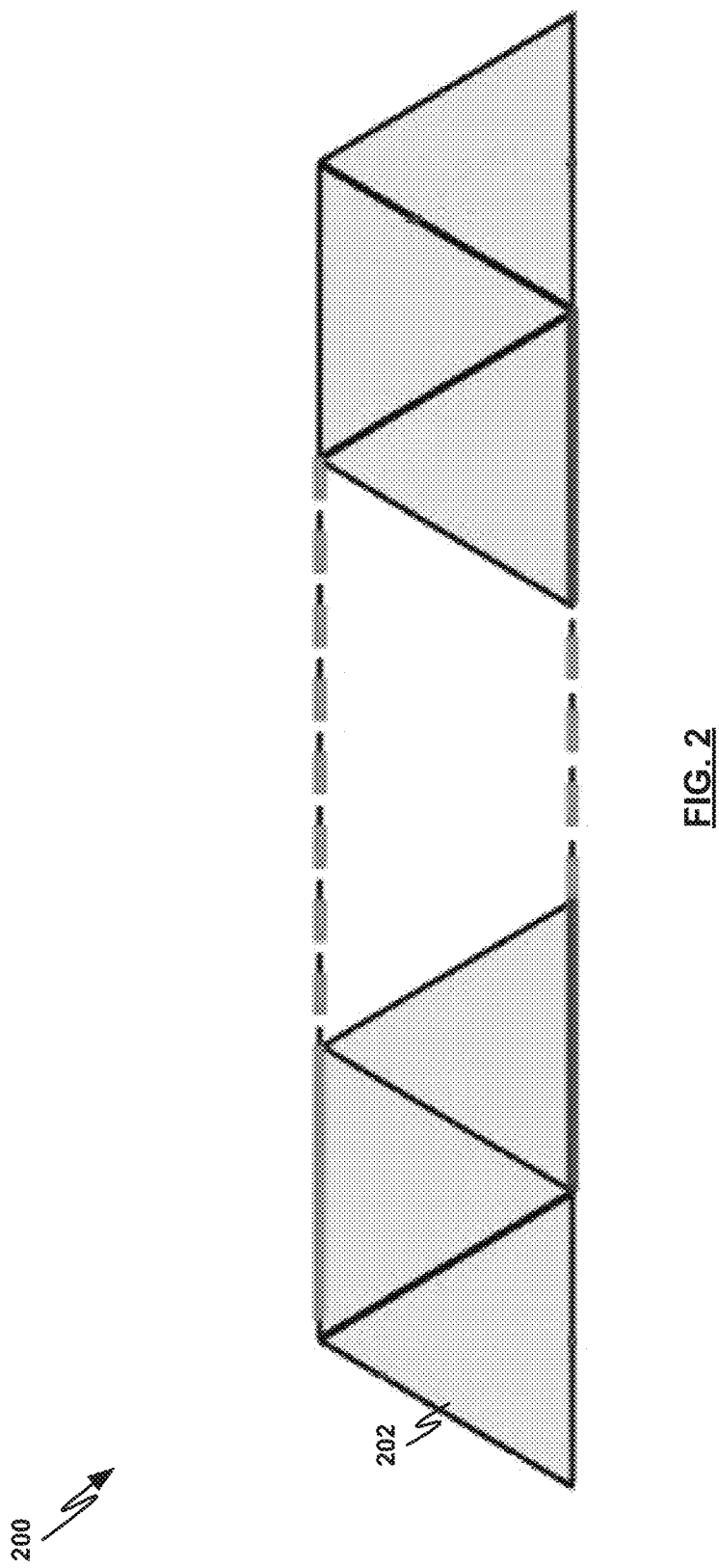
FIG. 2 depicts a chain of equilateral triangles.

As described above with reference to FIG. 1, the methods described herein for generating a surface that approximates one or more CAD surfaces include the step of creating an equilateral triangle mesh on an input tessellation. As detailed below, the generation of this mesh may include generating multiple chains of equilateral triangles. To illustrate an example chain of equilateral triangles, reference is made to FIG. 2. This figure depicts a chain of equilateral triangles 200. As shown, the chain 200 comprises a series of equilateral triangles 202 connected by common sides. The chain 200 and other chains of equilateral triangles described below may have variable lengths, as indicated by the broken lines shown in the figure.

To illustrate the generation of a mesh $M^0$ of equilateral triangles on an input CAD tessellation, reference is made to FIGS. 3A-3I. At a high level, the generation of the mesh $M^0$ comprises three steps: (i) forming an initial mesh of equilateral triangles on the tessellation, where edges of triangles of the initial mesh are contained within a boundary of the tessellation; (ii) adding additional equilateral triangles to the initial mesh to form a modified mesh, the modified mesh having a boundary that contains at least portions of the boundary of the tessellation; and (iii) adding additional equilateral triangles to the boundary of the modified mesh to form a second modified mesh, the second modified mesh having a boundary that lies outside of the boundary of the tessellation, and the second modified mesh comprising the equilateral triangle mesh $M^0$. From these high level steps, it should be appreciated that the equilateral triangle mesh $M^0$ has a boundary that lies outside of the boundary of the tessellation, such that an "overhang" is formed. The boundary of the equilateral triangle mesh $M^0$ overhangs over the surface of the tessellation, extending an incremental finite distance away from the exterior boundary of the tessellation. Aspects of these high-level steps and the generation of the overhang are described in further detail below.

Figure 3B:
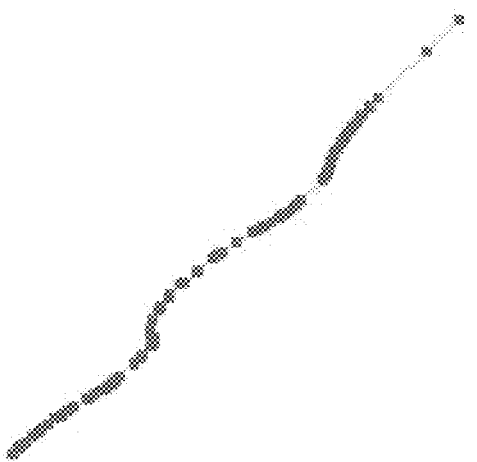
FIG. 3B depicts an intersection curve located in a central region of the tessellation of FIG. 3A.
Figure 3A:
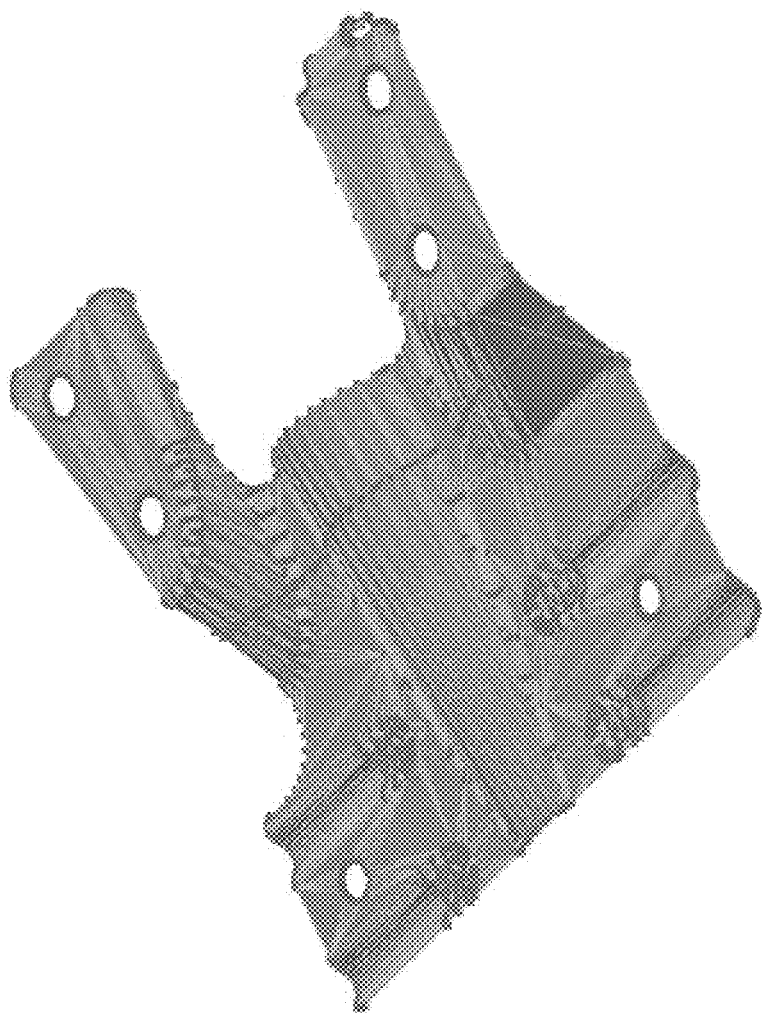
FIG. 3A depicts a tessellation of one or more CAD surfaces, the tessellation approximating the one or more CAD surfaces via a plurality of triangles.

FIG. 3A depicts a tessellation of one or more CAD surfaces, the tessellation approximating the one or more CAD surfaces via a plurality of triangles. An initial step in the generating of the equilateral triangle mesh $M^0$ may be generating an intersection curve located in a central region of the tessellation, where the intersection curve extends between first and second points on a boundary of the tessellation. Prior to generating the intersection curve, a determination may be made as to what is an acceptable (e.g., optimal) orientation for creating the intersection curve. FIG. 3B depicts an intersection curve located in a central region of the tessellation of FIG. 3A. The generation of the intersection curve in this central (e.g., center) region of the tessellation enables the equilateral triangle mesh $M^0$ to begin at the center of the tessellation surface.

Figure 3D:
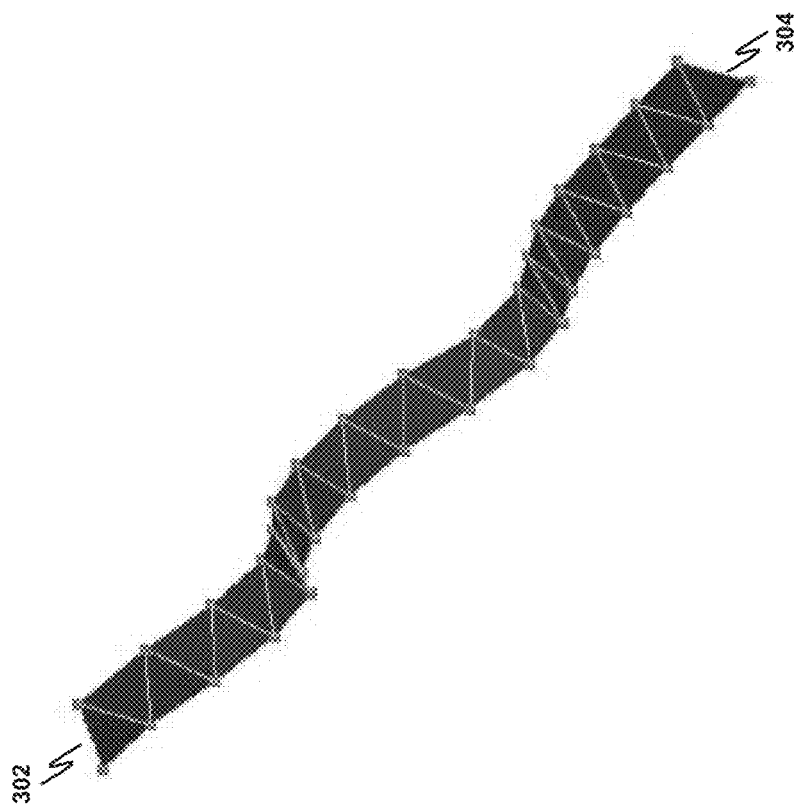
FIGS. 3C and 3D depict a first chain of equilateral triangles generated along a first side of the intersection curve of FIG. 3B.
Figure 3C:
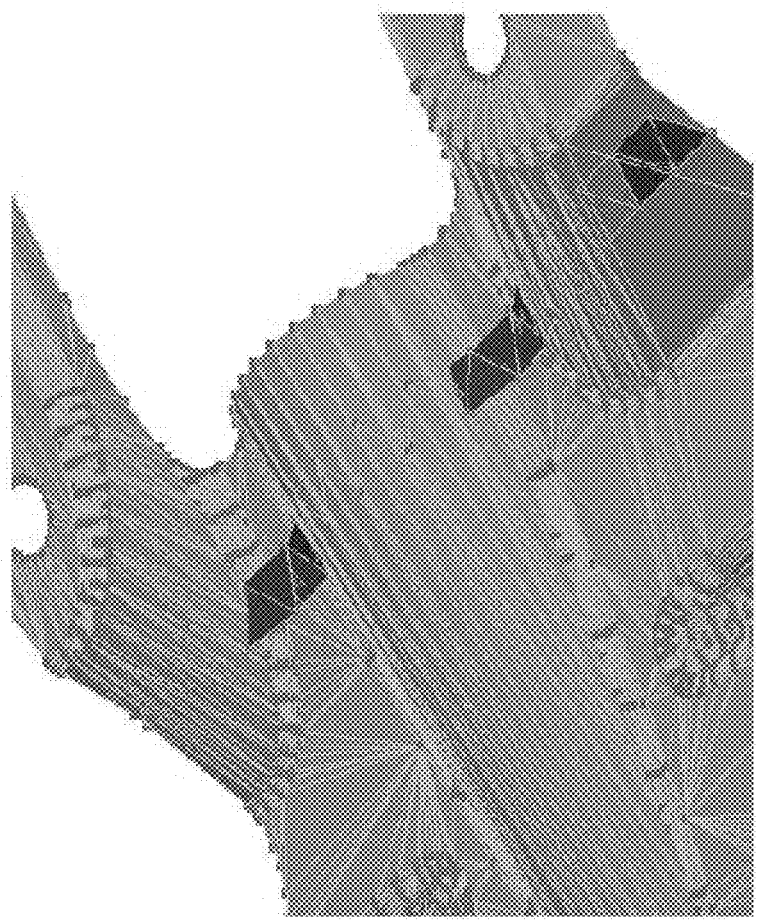

FIGS. 3C and 3D depict a first chain of equilateral triangles generated along a first side of the intersection curve of FIG. 3B. After generating the intersection curve, a next step in the generation of the equilateral triangle mesh $M^0$ may be generating a first chain of equilateral triangles along a first side of the intersection curve. FIGS. 3C and 3D depict an example of the first chain. The first chain (and other chains described herein) comprises a series of equilateral triangles connected by common sides and may be similar to the chain 200 of FIG. 2. It is noted that the first chain shown in FIGS. 3C and 3D has a length that corresponds to that of the intersection curve (i.e., the first chain runs an entirety of the length of the intersection curve). The first chain has first and second ends 302, 304, and in an example, one or more equilateral triangles that extend across the boundary of the tessellation are added to the first and second ends 302, 304. Such added triangles may comprise a portion of the overhang of equilateral triangles that extend over the boundary of the tessellation, as described above. Further details on the generation of the overhang are described below.

Figure 3F:
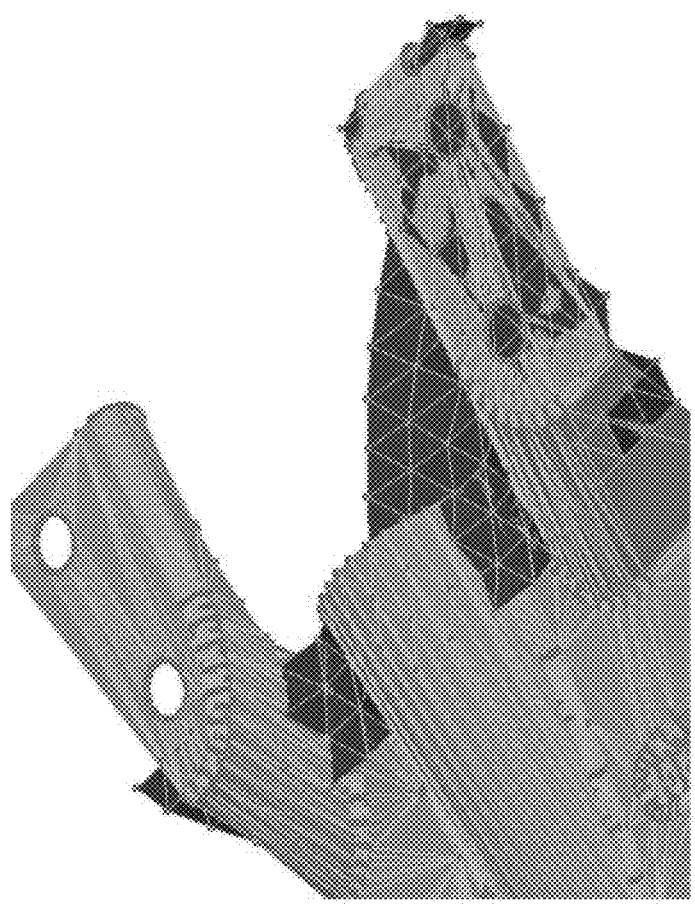
FIG. 3F depicts additional chains of equilateral triangles formed between the first chain of equilateral triangles and a boundary of the tessellation.
Figure 3E:
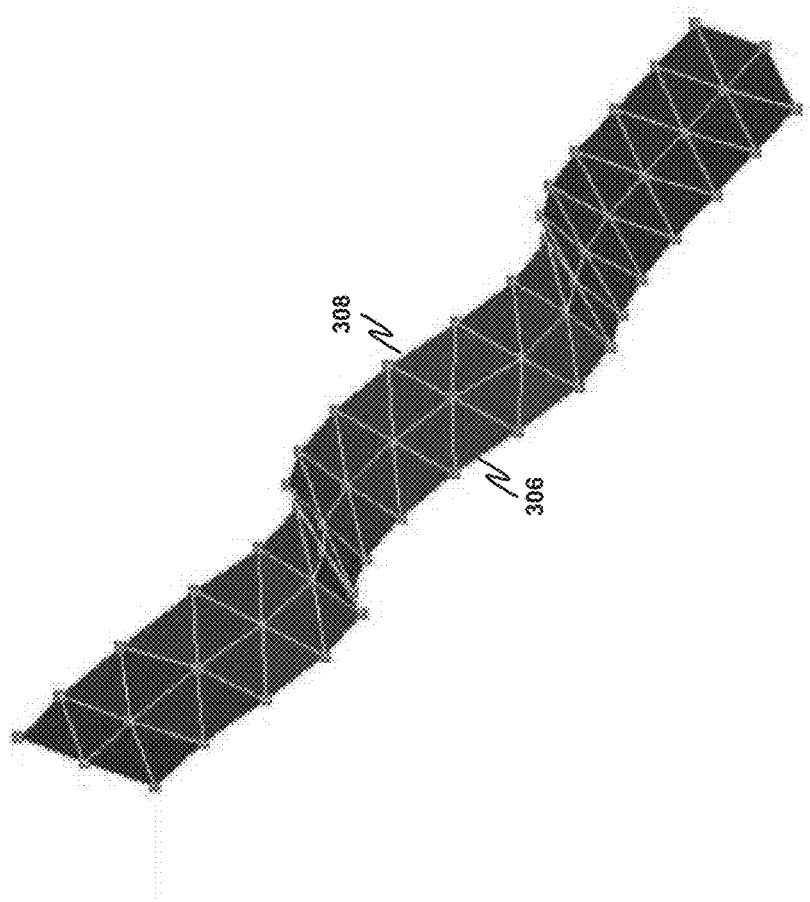
FIG. 3E depicts an additional chain of equilateral triangles generated along a side of the first chain of equilateral triangles of FIGS. 3C and 3D.

FIG. 3E depicts an additional chain of equilateral triangles generated along a side of the first chain of equilateral triangles of FIGS. 3C and 3D. In this figure, the first chain of equilateral triangles (as illustrated in FIGS. 3C and 3D) is labeled with reference numeral 306, and the new chain added alongside the first chain is labeled with reference numeral 308. In a like manner, additional chains of equilateral triangles are generated and added between the first chain 306 and the boundary of the tessellation, as illustrated in FIG. 3F. The chains are connected at common edges, as illustrated in the figure. It should be appreciated that at the completion of this step, chains of equilateral triangles have been generated on approximately one half of the tessellation (e.g., the chains are formed between the intersection curve and the boundary of the tessellation in one direction, as illustrated in FIG. 3F).

The other half of the tessellation is treated in a like manner. Thus, a chain of equilateral triangles (referred to herein as the "second chain") is generated along a second side of the intersection curve of FIG. 3B. Like the first chain generated along the other side of the intersection curve, the second chain has a length that corresponds to that of the intersection curve. Additionally, like the first chain, the second chain has first and second ends, and in an example, one or more equilateral triangles that extend across the boundary of the tessellation are added to the first and second ends of the second chain. Such added triangles may comprise a portion of the aforementioned overhang of equilateral triangles that extend over the boundary of the tessellation.

Figure 3G:
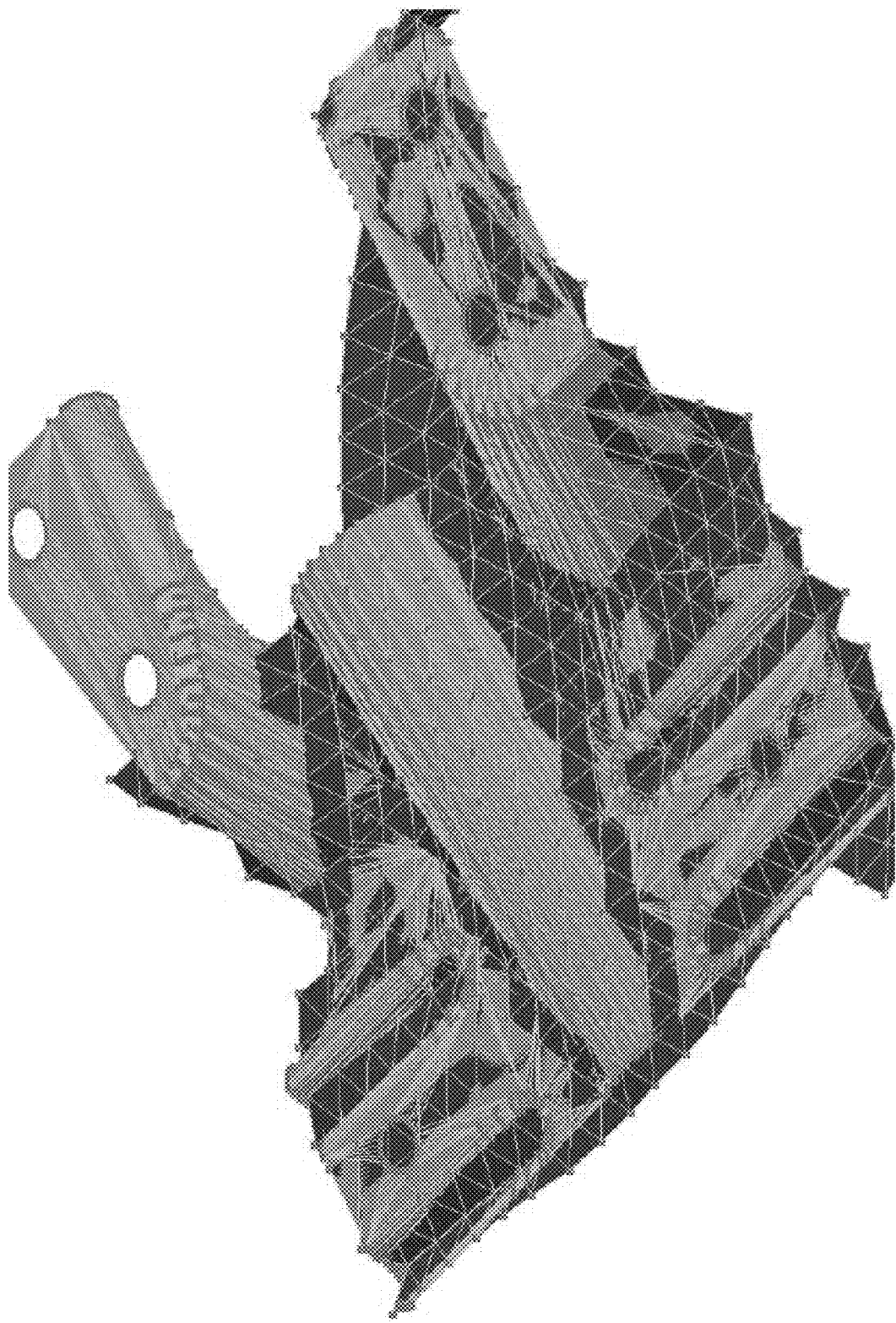
FIG. 3G depicts additional chains of equilateral triangles formed on a second half of the tessellation.

Additional chains of equilateral triangles are generated and added between the second chain and the boundary of the tessellation, as illustrated in FIG. 3G.

Figure 3H:
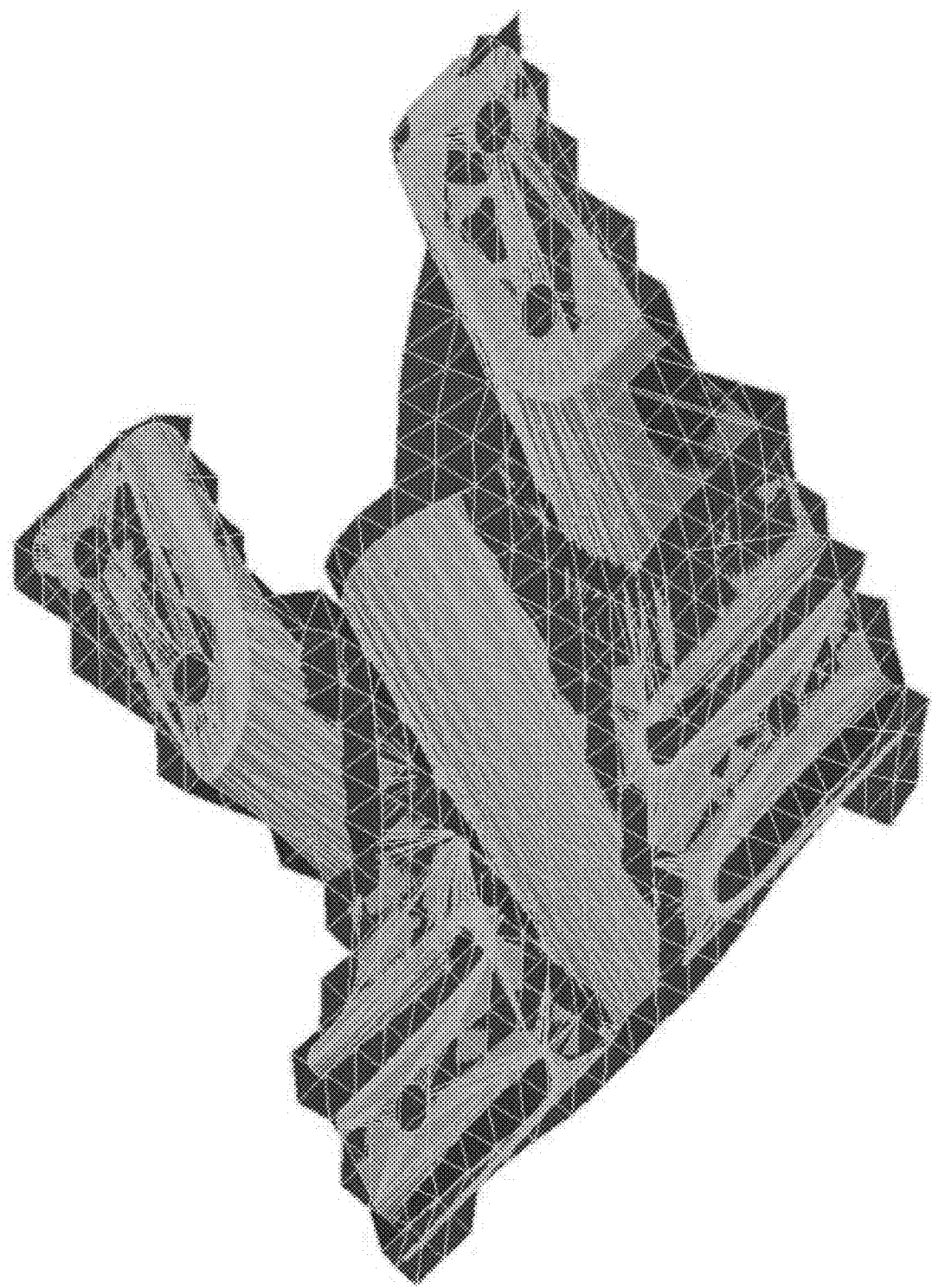
FIG. 3H depicts an addition of equilateral triangles to the mesh of FIG. 3G to form a modified mesh, the modified mesh containing the input CAD tessellation.
Figure 31:
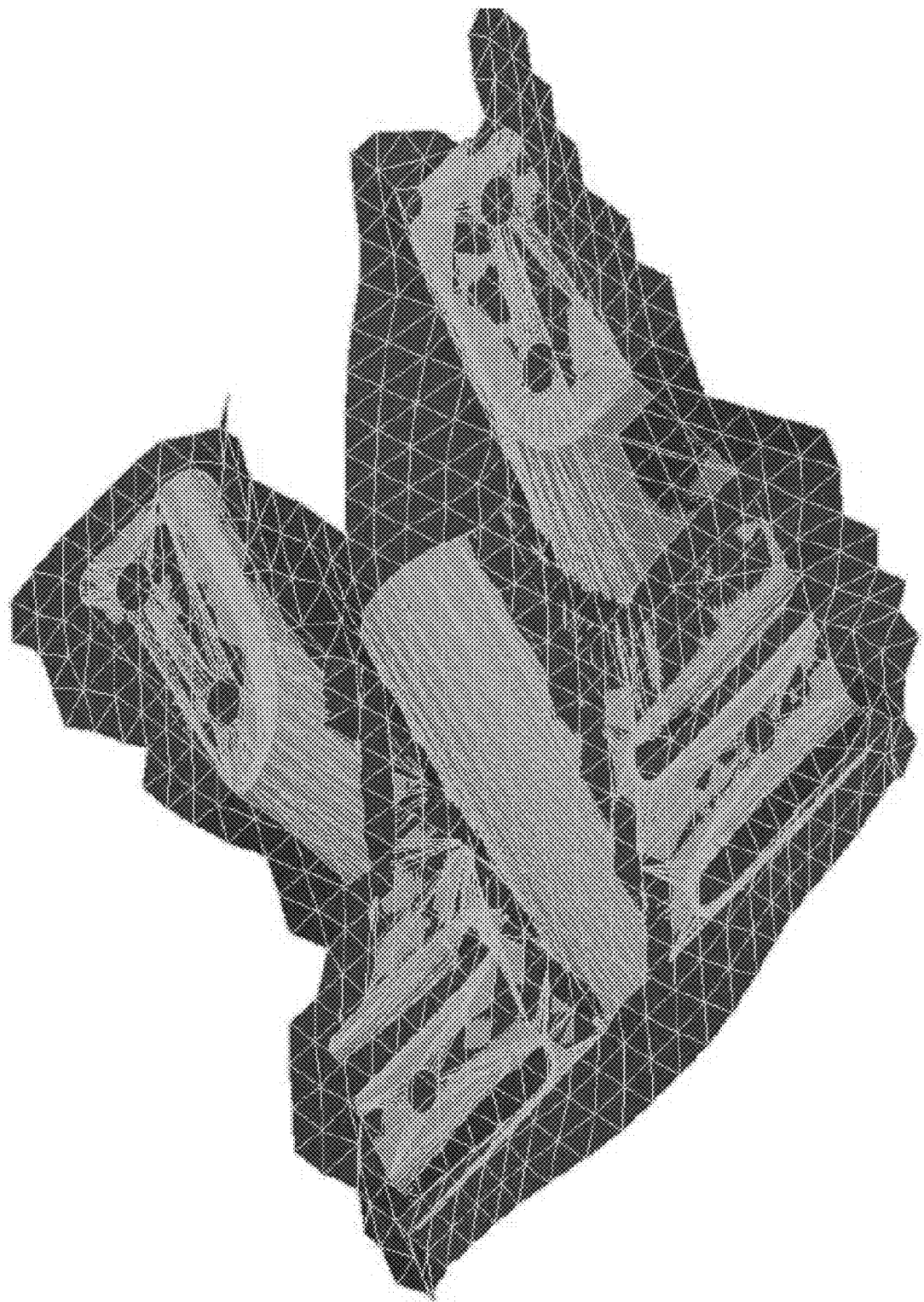

It should be appreciated that at the completion of this step, chains of equilateral triangles have been generated on an entirety of the tessellation. In an example, these chains of equilateral triangles are connected at common edges to from an initial mesh, where edges of the initial mesh are contained within the boundary of the tessellation. Next, FIG. 3H depicts an addition of equilateral triangles to the initial mesh of FIG. 3G to form a modified mesh, where the modified mesh contains the input CAD tessellation. Subsequently, in FIG. 3I, additional equilateral triangles are added to the boundary of the modified mesh of FIG. 3H to form a second modified mesh. The second modified mesh of FIG. 3I extends beyond the boundary of the input tessellation and comprises the equilateral triangle mesh $M^0$, in an example. As described above, the equilateral triangle mesh $M^0$ is subsequently used in forming the control mesh $\overline{M}$. It should be appreciated that the equilateral triangle mesh $M^0$ illustrated in FIG. 3I has a boundary that lies outside of the boundary of the tessellation, such that the aforementioned "overhang" is formed. The boundary of the equilateral triangle mesh $M^0$ thus overhangs over the surface of the tessellation, extending an incremental finite distance away from the exterior boundary of the tessellation.

Figure 4:
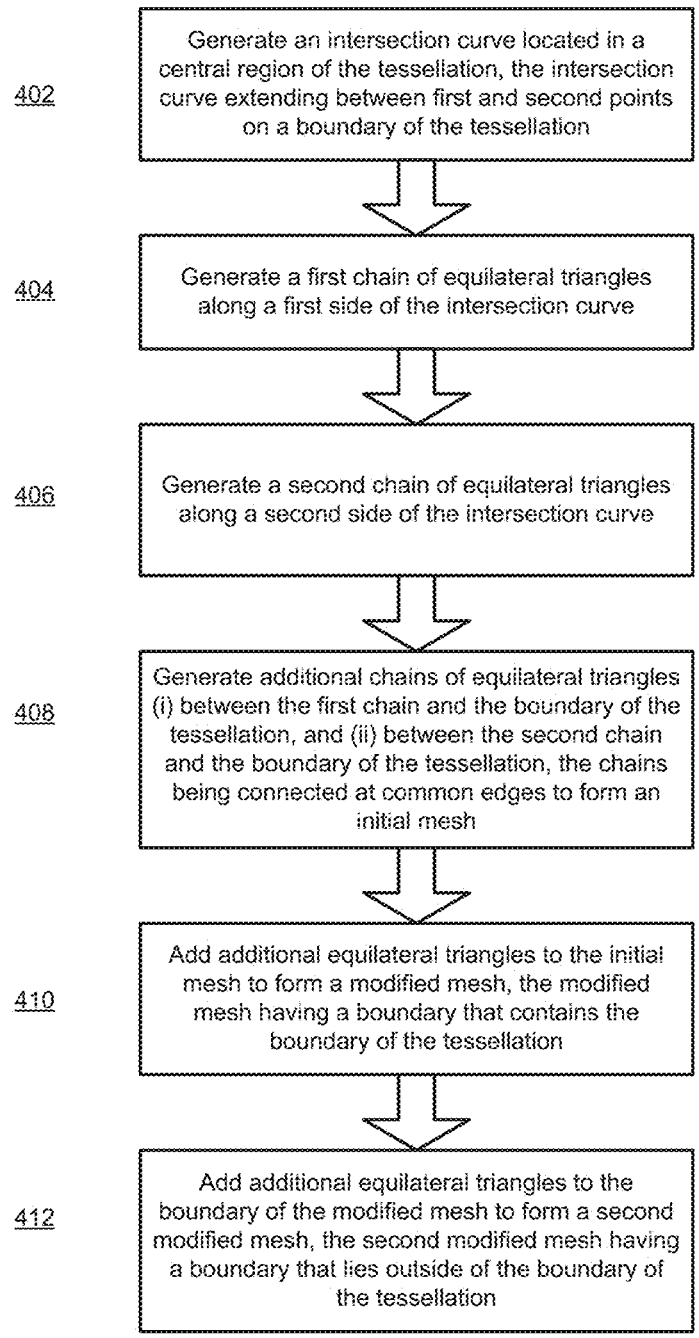
FIG. 4 is a flowchart illustrating example steps of a method for generating a mesh of equilateral triangles on an input tessellation.

FIG. 4 is a flowchart illustrating example steps of a method for generating a mesh of equilateral triangles on an input tessellation. Details of the example steps of FIG. 4 are described above with reference to FIGS. 3A-3I. At 402, an intersection curve located in a central region of the tessellation is generated, where the intersection curve extends between first and second points on a boundary of the tessellation. At 404, a first chain of equilateral triangles is generated along a first side of the intersection curve. At 406, a second chain of equilateral triangles is generated along a second side of the intersection curve. At 408, additional chains of equilateral triangles are generated (i) between the first chain and the boundary of the tessellation, and (ii) between the second chain and the boundary of the tessellation. The chains are connected at common edges to form an initial mesh, where edges of triangles of the initial mesh are contained within the boundary of the tessellation. At 410, additional equilateral triangles are added to the initial mesh to form a modified mesh, the modified mesh having a boundary that contains at least portions of the boundary of the tessellation. At 412, additional equilateral triangles are added to the boundary of the modified mesh to form a second modified mesh, the second modified mesh having a boundary that lies outside of the boundary of the tessellation. In examples, the second modified mesh comprises the equilateral triangle mesh $M^0$ described herein.

FIGS. 5A-5D illustrate aspects of performing ETM refinement at a boundary of a tessellation. As described above with reference to step 108 of FIG. 1, the control mesh $\overline{M}$ is refined to reduce an evaluation error, and specifically, in an example, a local refinement is performed on one or more regions of the control mesh $\overline{M}$ that have an error that is greater than a threshold value. Further, as described herein, the control mesh of the loop subdivision surface is defined over the boundary of the geometry (e.g., over the boundary of the tessellation). This may be performed to have a good performance on evaluation and projection, and the control mesh should have a minimum of extraordinary nodes (valence !=6). The boundary of the geometry is a critical area because the nodes are on the surface, while also trimming the surface extents. The size of triangles used to create the ETM is critical to define a good approximation of the boundary.

The boundary may be difficult to mesh in ETM. To illustrate this, reference is made to FIG. 5A. As shown, a position of a node 502 is difficult to define because it is too far from the geometry. Thus, in this example, the node 502 is far from the geometry, and it is difficult to find a position that satisfies the best distance from a tangent plane at the boundary condition. To address this issue, it may be possible to sub-divide this triangle to have some nodes near the boundary. The initial node can subsequently be defined by an inverse solution of the subdivision process. To illustrate this, reference is made to FIG. 5B. As shown in this figure, certain nodes need another refinement to be defined. After performing this refinement (e.g., sub-division), certain nodes are easier to define because they are not very far from the geometry.

Figure 5A:
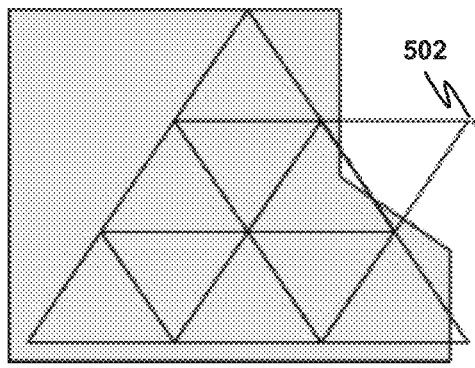
FIGS. 5A-5D illustrate aspects of performing ETM refinement at a boundary of a tessellation.
Figure 5B:
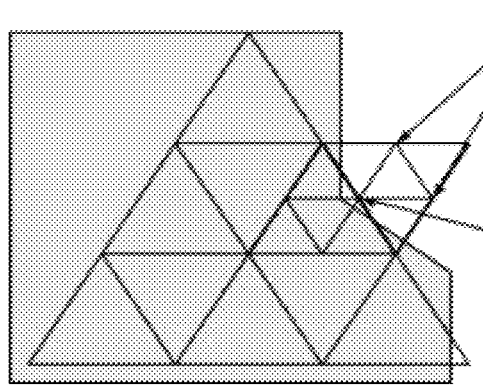
Figure 5C:
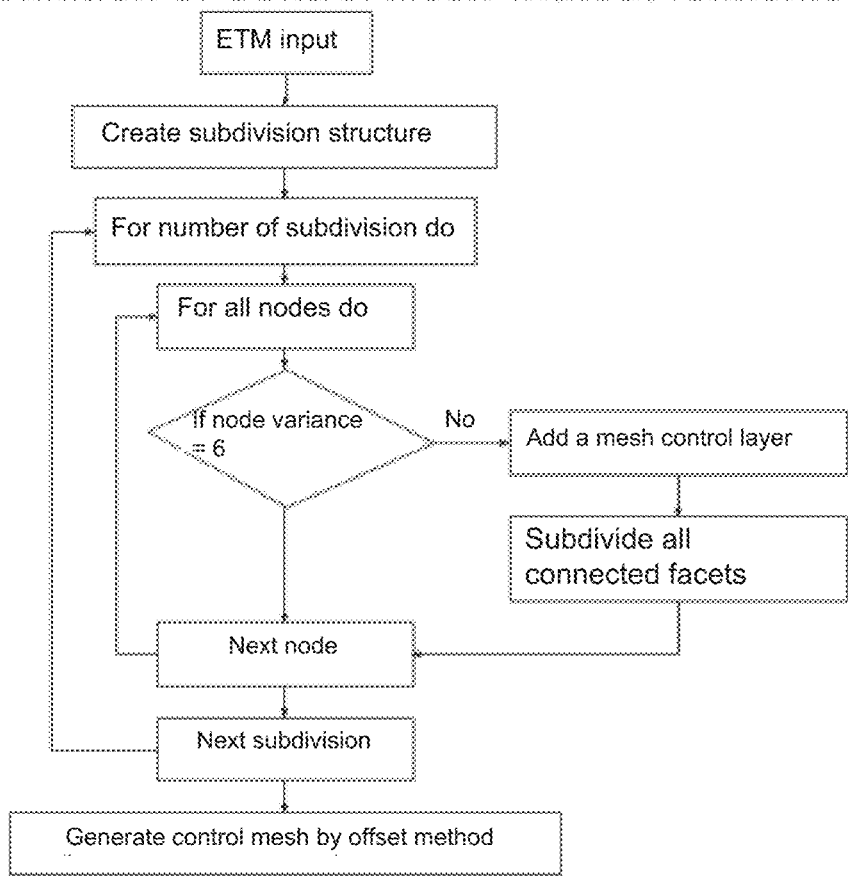
Figure 5D:
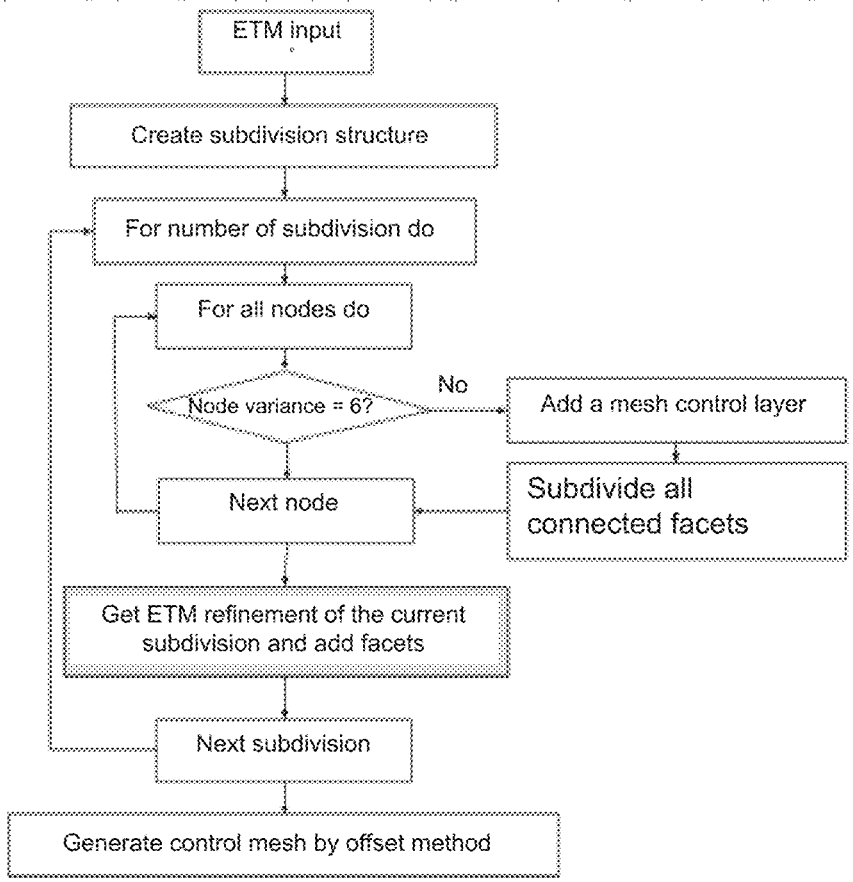

In examples, an ETM refinement step is included in the control mesh definition process. In examples, the control mesh utilizes an initialization that consists of creating a subdivision layer for extraordinary nodes. This is because it is desirable to be able to evaluate the nodes, and extraordinary nodes may require some local refinement to be evaluated. It is at this step that ETM refinement may be included in the control mesh at the respective subdivision layer. To illustrate the use of refinement in the control mesh definition process, reference is made to FIGS. 5C and 5D. FIG. 5C illustrates steps of a control mesh definition process that does not utilize ETM refinement, and FIG. 5D illustrates steps of a control mesh definition process that does utilize ETM refinement.

Figure 6C:
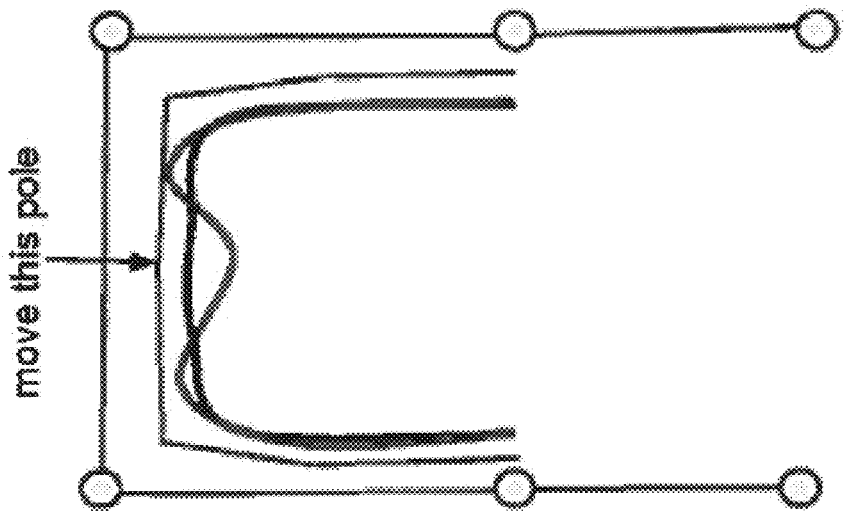
FIGS. 6A, 6B, and 6C illustrate aspects of performing a local refinement on one or more regions of a control mesh.
Figure 6B:
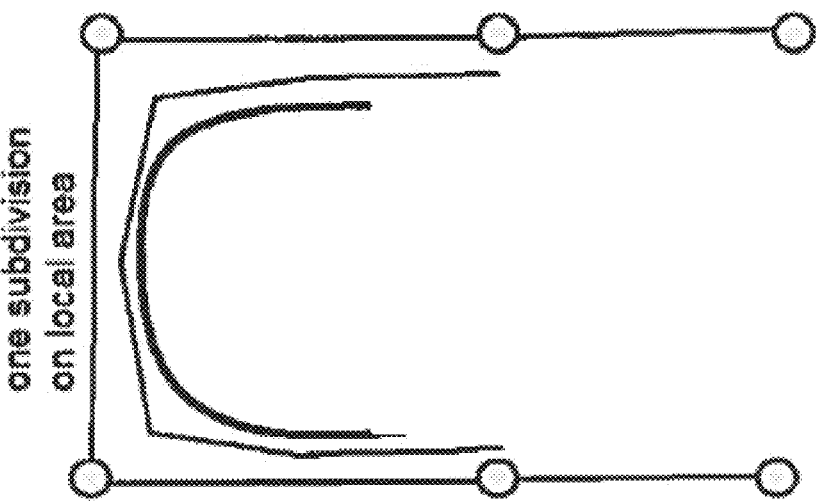
Figure 6A:
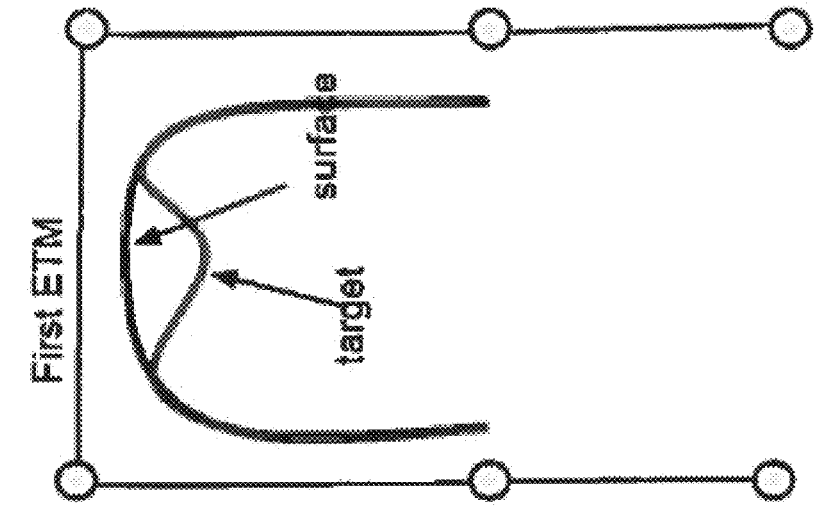

FIGS. 6A, 6B, and 6C illustrate aspects of performing a local refinement on one or more regions of a control mesh. As described herein, the control mesh is composed of equilateral triangles, in examples. Because equilateral triangles are used, it may be advantageous to use local area refinements to fit the surface. The subdivision can be applied on a local area to increase accuracy. FIG. 6A illustrates a first ETM, and FIG. 6B illustrates one subdivision on a local area. In FIG. 6C, the middle of a CM1 control mesh can be moved to fit the target. The first refinement enables the evaluation to be closer to the target without any change out of the refinement area. Other refinements may be applied recursively, in embodiments.

Figure 7:
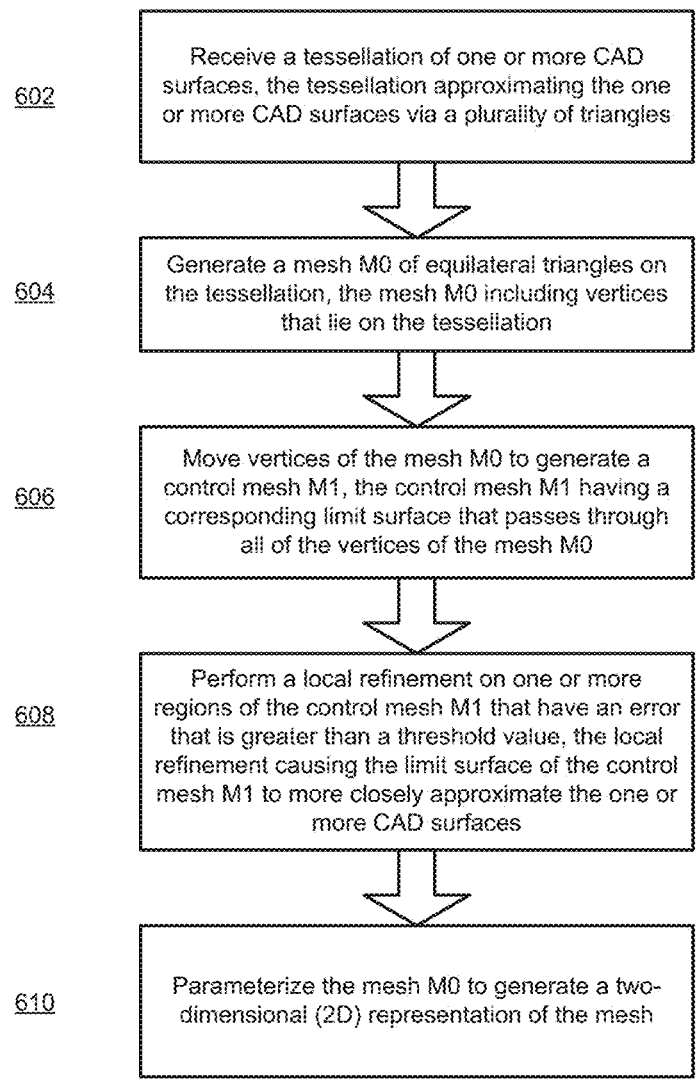
FIG. 7 is a flowchart illustrating example steps of a method for generating a surface that approximates one or more CAD surfaces.

FIG. 7 is a flowchart illustrating example steps of a method for generating a surface that approximates one or more CAD surfaces. At 602, a tessellation of one or more CAD surfaces is received, where the tessellation approximates the one or more CAD surfaces via a plurality of triangles. At 604, a mesh $M^0$ of equilateral triangles is generated on the tessellation, with the mesh $M^0$ including vertices that lie on the tessellation. At 606, vertices of the mesh $M^0$ are moved to generate a control mesh $\overline{M}$. The control mesh $\overline{M}$ has a corresponding limit surface $M^\infty$ that passes through all of the vertices of the mesh $M^0$. At 608, a local refinement is performed on one or more regions of the control mesh $\overline{M}$ that have an error that is greater than a threshold value. The local refinement causes the limit surface $M^\infty$ of the control mesh $\overline{M}$ to more closely approximate the one or more CAD surfaces. At 610, the mesh $M^0$ is parameterized to generate a two-dimensional (2D) representation of the mesh $M^0$. Based on the performing of the steps 602, 604, 606, 608, 610, evaluation and/or projection procedures may be performed, where such procedures include (i) determining a point in three-dimensional (3D) space that corresponds to a point on the 2D representation, (ii) determining a closest perpendicular point on the limit surface from a given 3D point in space, and (iii) determining first and second derivative values, curvature values, and other standard surface evaluations.

Figure 8A:
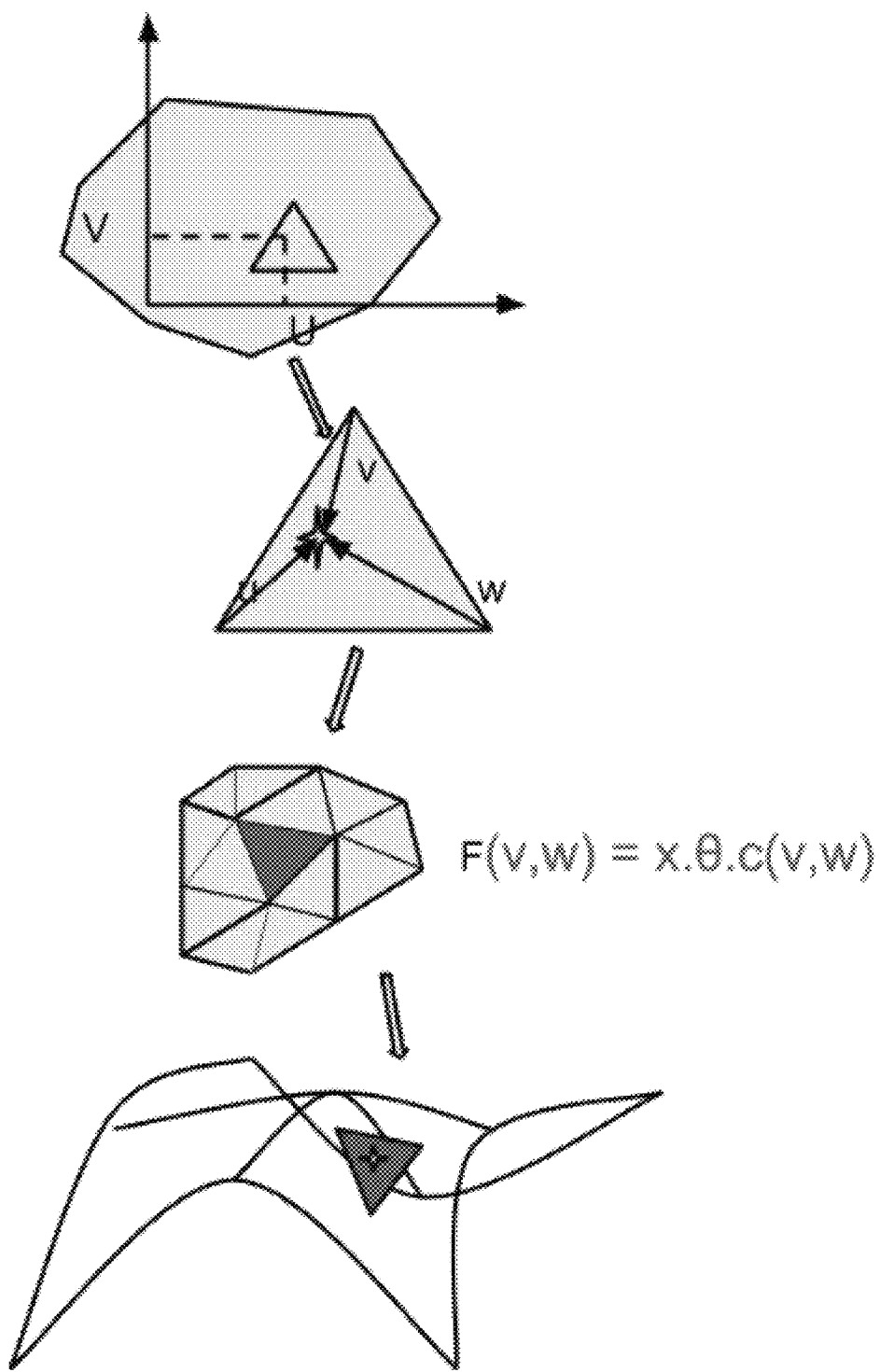
FIGS. 8A and 8B illustrate features of evaluation and projection procedures, respectively.
Figure 8B:
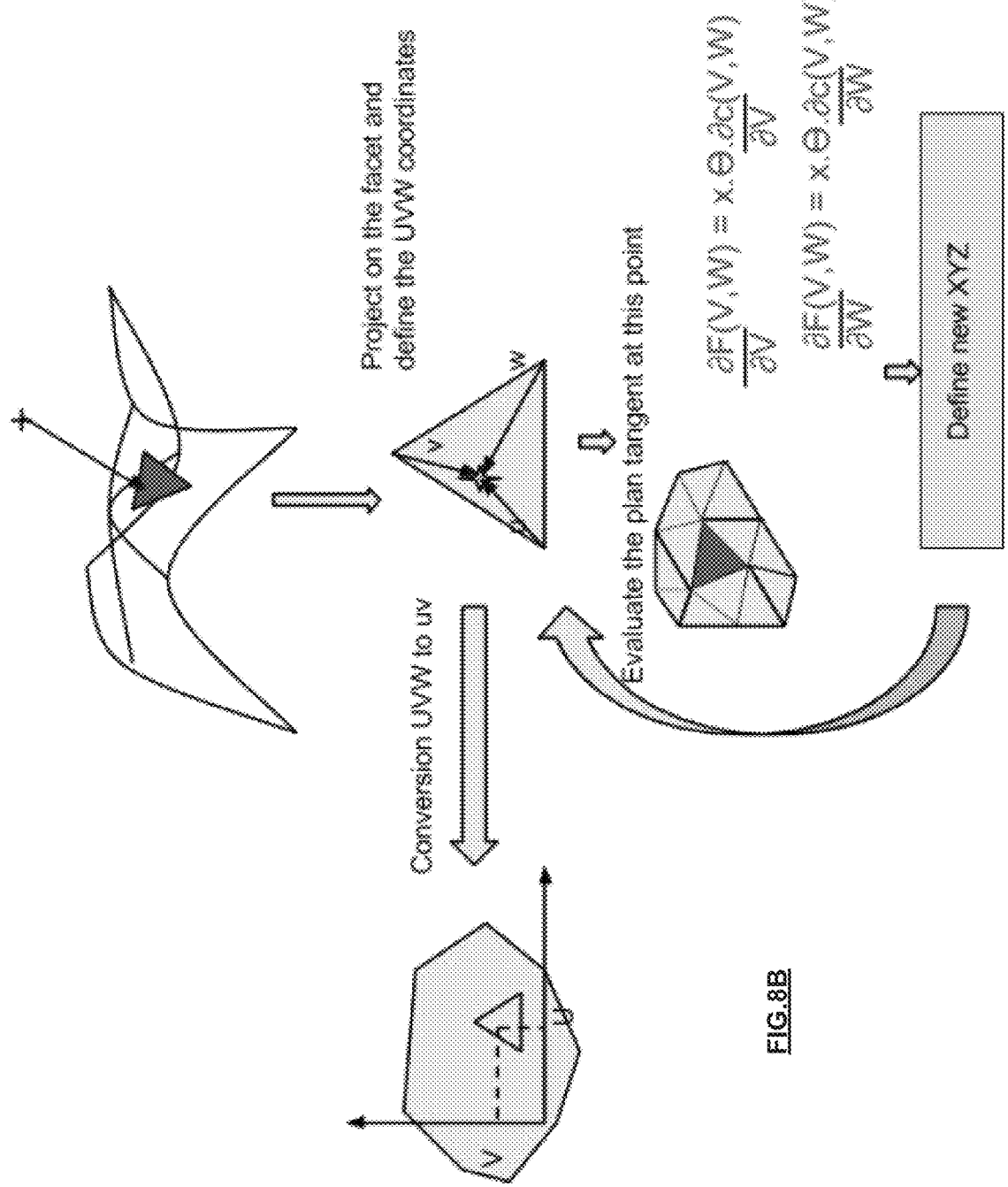

FIGS. 8A and 8B illustrate features of evaluation and projection procedures, respectively. FIG. 8A illustrates an evaluation of a point in UV space. In an example, the evaluation includes: (i) from the UV, retrieve the facets that contain the p(U,V); (ii) from these facets, define the barycentric coordinates of the P(U,V), i.e., (UV)→(u,v,w) (the barycentric coordinate is the coordinate of a point dependant of the three nodes of a triangle, and if the point is inside the triangle, the coordinate verifies that u+v+w<1); and (iii) from this (u,v,w), the XYZ is defined by the loop surface equation x(v,w)=x.θ.c(v,w), with u+v+w=1.

FIG. 8B illustrates a projection of a point. The projection is the function that gives the UV coordinate from a XYZ point orthogonal to the surface. Example projection steps are: (i) find a facet of the input mesh that contains the normal projection of the point; (ii) with this facet and the projected point, evaluate the true tangent plan with the first derivative function, i.e., x'(v,w)=x.θ.c'(v,w); (iii) define Δu, Δv, Δw to evaluate next step; (iv) at the next step, evaluate point and first derivative, and continue to converge to the solution.

This disclosure provides systems and methods for generating a surface that approximates one or more CAD surfaces. In some embodiments, the surface that is generated is a closed surface. The closed surface is generated, in embodiments, when the one or more CAD surfaces define a closed surface. To illustrate aspects of the generation of a closed surface, reference is made to FIGS. 9A, 9B, and 9C. As described above, in generating a surface that approximates one or more CAD surfaces, a mesh of equilateral triangles is generated. Specifically, in some embodiments, the generation of the mesh of equilateral triangles includes the following steps: (i) generating an intersection curve located in a central region of the input, the intersection curve extending between first and second points on a boundary of the input; (ii) generating a first chain of equilateral triangles along a first side of the intersection curve; (iii) generating a second chain of equilateral triangles along a second side of the intersection curve; (iv) generating additional chains of equilateral triangles between the first chain and the boundary of the input and between the second chain and the boundary of the input, the chains being connected at common edges to form an initial mesh, wherein edges of triangles of the initial mesh are contained within the boundary of the input; (v) adding additional equilateral triangles to the initial mesh to form a modified mesh, the modified mesh having a boundary that contains at least portions of the boundary of the input; and (vi) adding additional equilateral triangles to the boundary of the modified mesh to form a second modified mesh, the second modified mesh having a boundary that lies outside of the boundary of the input, wherein the second modified mesh comprises the mesh.

Figure 9A:
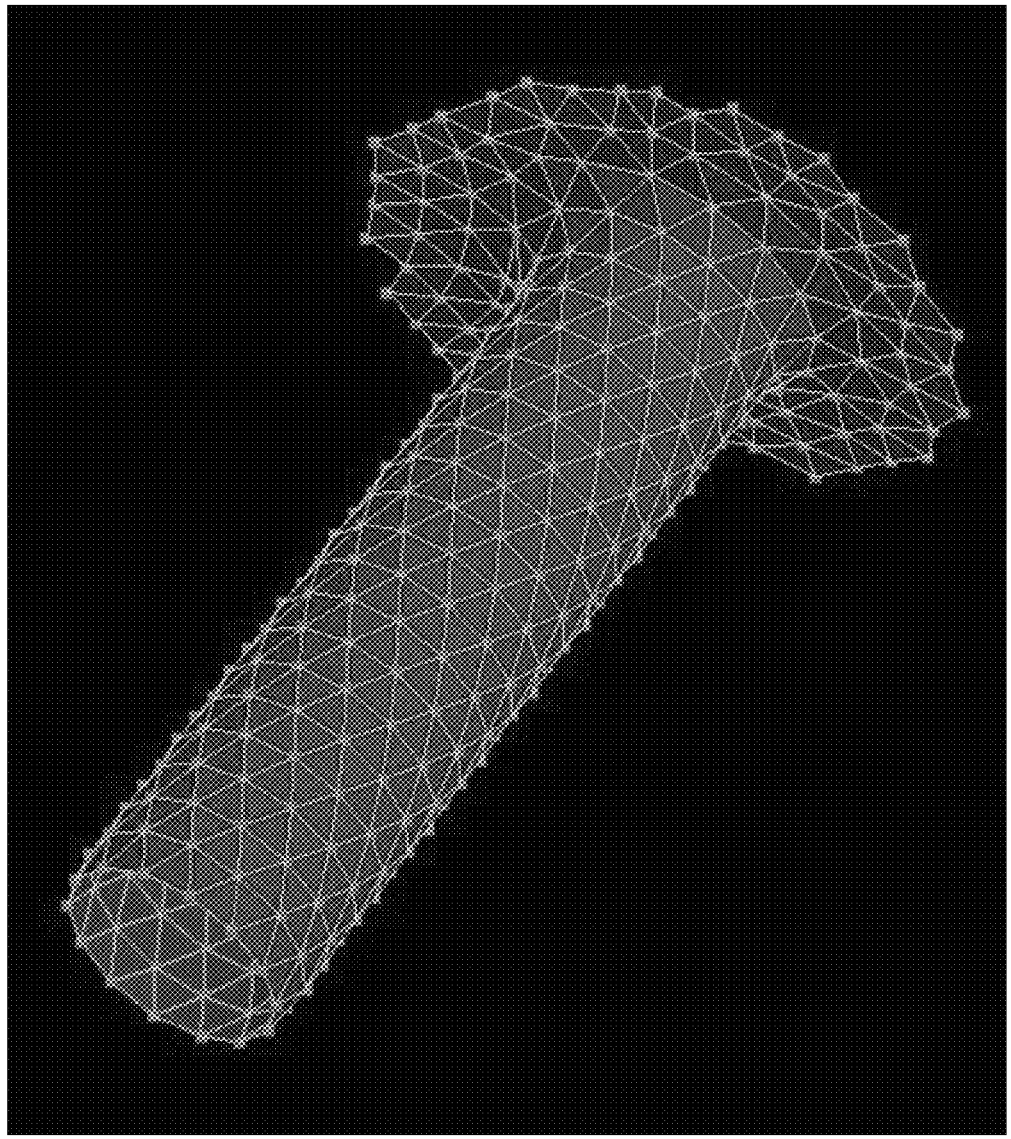
FIGS. 9A, 9B, and 9C illustrate generation of a closed surface in accordance with embodiments of the instant disclosure.
Figure 9B:
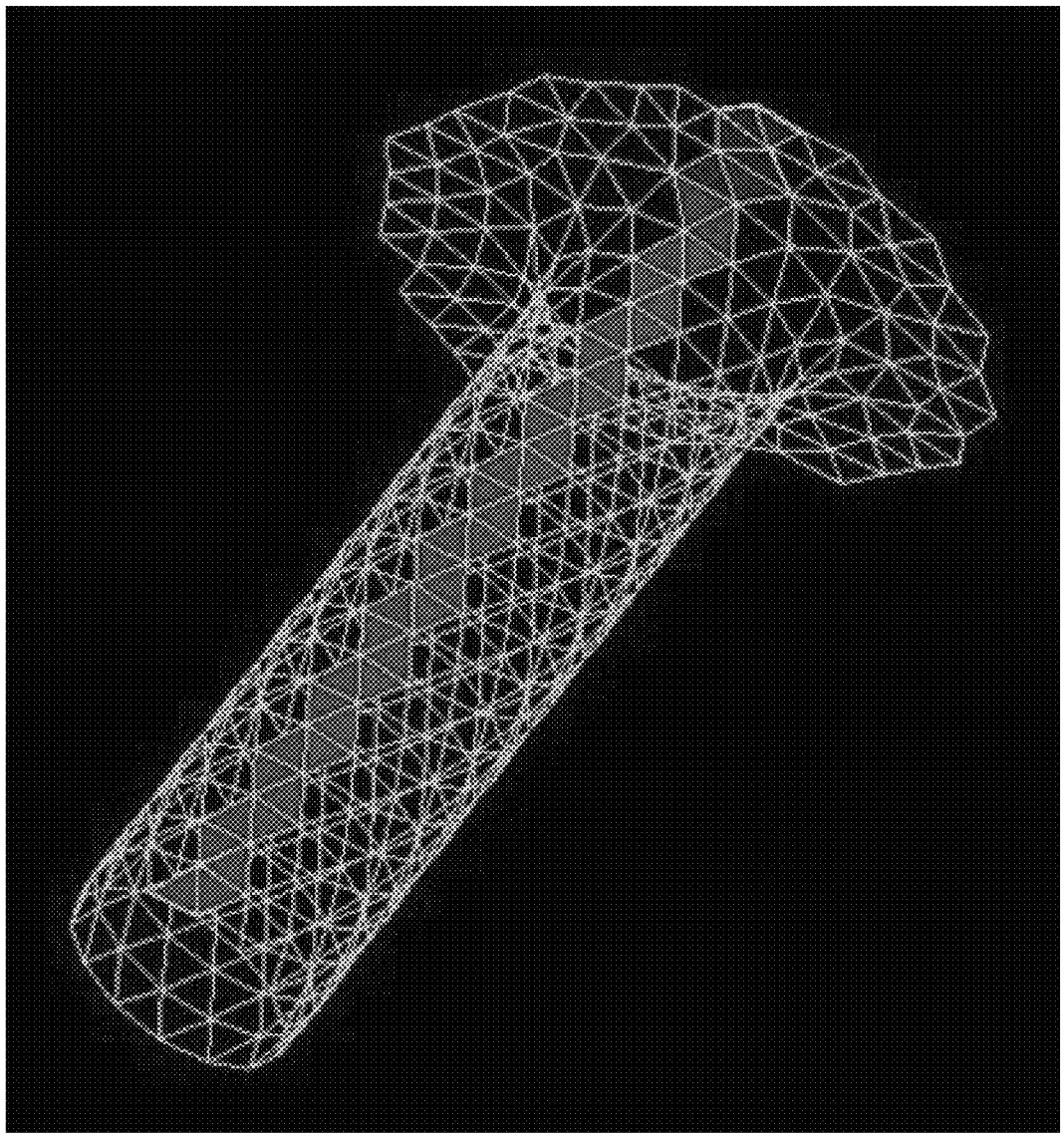
Figure 9C:
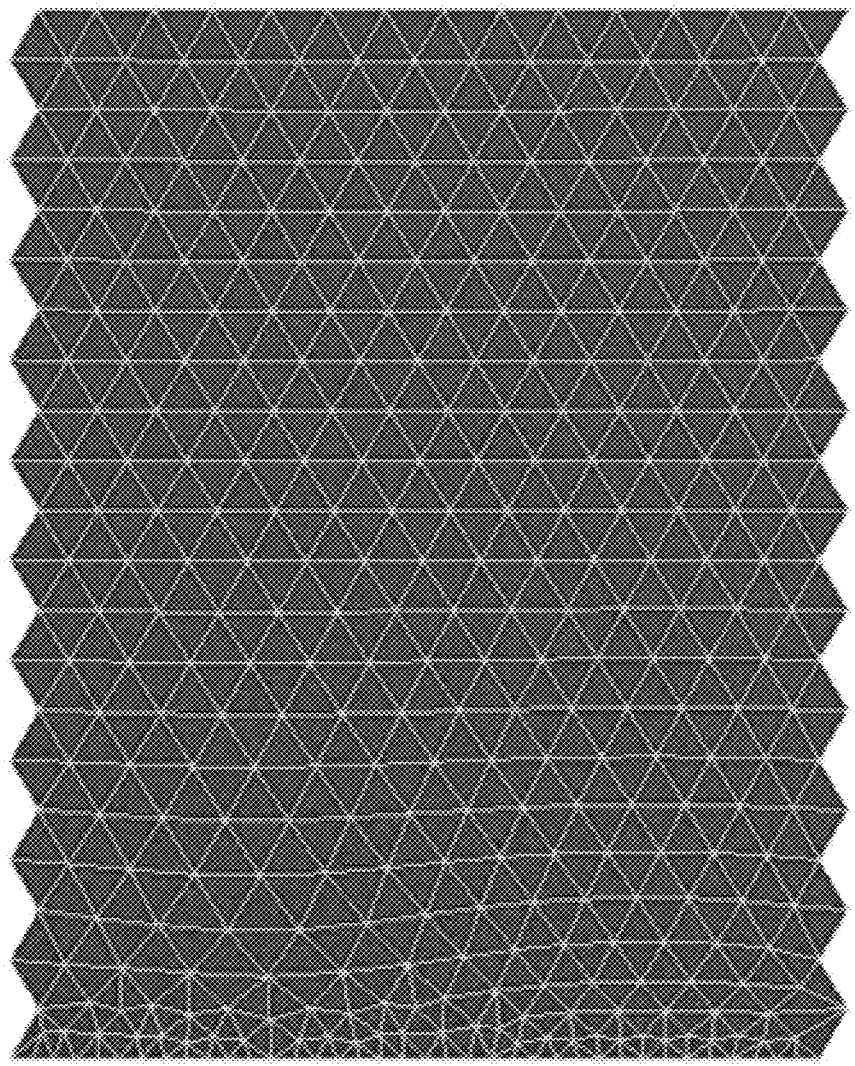

In generating a closed surface when the one or more CAD surfaces define a closed surface, the aforementioned initial mesh may be understood as comprising a first closed surface. In generating the closed surface, equilateral triangles are generated on the one or more CAD surfaces, including on the first closed surface. FIG. 9A illustrates an example closed equilateral triangle mesh. Further, with a vertex of the initial closed surface, a line is propagated on the equilateral triangles to generate a seam that is used to construct the 2D representation of the mesh of equilateral triangles. FIG. 9B illustrates the seam area defined in the building of the equilateral triangle mesh. FIG. 9C illustrates the 2D open mesh. A projection procedure that identifies a cut of the seam in iterations of the projection procedure is performed.

This written description uses examples to disclose the invention, including the best mode, and also to enable a person skilled in the art to make and use the invention. The patentable scope of the invention may include other examples. Additionally, the methods and systems described herein may be implemented on many different types of processing devices by program code comprising program instructions that are executable by the device processing subsystem. The software program instructions may include source code, object code, machine code, or any other stored data that is operable to cause a processing system to perform the methods and operations described herein. Other implementations may also be used, however, such as firmware or even appropriately designed hardware configured to carry out the methods and systems described herein.

The systems' and methods' data (e.g., associations, mappings, data input, data output, intermediate data results, final data results, etc.) may be stored and implemented in one or more different types of computer-implemented data stores, such as different types of storage devices and programming constructs (e.g., RAM, ROM, Flash memory, flat files, databases, programming data structures, programming variables, IF-THEN (or similar type) statement constructs, etc.). It is noted that data structures describe formats for use in organizing and storing data in databases, programs, memory, or other computer-readable media for use by a computer program.

The computer components, software modules, functions, data stores and data structures described herein may be connected directly or indirectly to each other in order to allow the flow of data needed for their operations. It is also noted that a module or processor includes but is not limited to a unit of code that performs a software operation, and can be implemented for example as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

It should be understood that as used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Further, as used in the description herein and throughout the claims that follow, the meaning of "each" does not require "each and every" unless the context clearly dictates otherwise. Finally, as used in the description herein and throughout the claims that follow, the meanings of "and" and "or" include both the conjunctive and disjunctive and may be used interchangeably unless the context expressly dictates otherwise; the phrase "exclusive of" may be used to indicate situations where only the disjunctive meaning may apply.

The invention claimed is:

1. A computer-implemented method for generating a surface that approximates one or more computer aided design (CAD) surfaces, the method comprising:
   receiving an input comprising a tessellation that approximates the one or more CAD surfaces via a plurality of triangles;
   generating a mesh of equilateral triangles on the input along two sides of an intersection curve extending from first and second points on a boundary of the input, the mesh including vertices that lie on the plurality of triangles of the input, wherein the mesh is initially wholly contained within the boundary defined by the input and then subsequently, along each side of the intersection curve, one or more additional equilateral triangles are added to extend over the boundary defined by the input;
   moving vertices of the mesh off of the input to generate a control mesh, the control mesh having a corresponding limit surface that passes through the vertices of the mesh, wherein the control mesh forms an overhang outside of the boundary defined by the input;
   performing a local refinement on one or more regions of the control mesh, the one or more regions having an error metric value that is greater than a threshold value, the local refinement causing the limit surface of the control mesh to more closely approximate the one or more CAD surfaces; and
   generating a two-dimensional (2D) representation of the mesh based on the parameterization of the mesh.

2. The computer-implemented method of claim 1, further comprising:
   performing an evaluation procedure, wherein the evaluation procedure includes
   (i) determining a point in three-dimensional (3D) space that corresponds to a point on the 2D representation, (ii) determining a closest perpendicular point on the limit surface from a given 3D point in space, and (iii) determining first and second derivative values, curvature values, and other standard surface evaluations.

3. The computer-implemented method of claim 1, further comprising: performing a projection procedure, wherein the projection procedure includes determining a closest perpendicular point on the limit surface that corresponds to a point in three-dimensional (3D) space.

4. The computer-implemented method of claim 1, wherein the generating of the mesh of equilateral triangles comprises:
   forming an initial mesh of equilateral triangles on the input, wherein edges of triangles of the initial mesh are contained within the boundary defined by the input; and
   adding additional equilateral triangles to the initial mesh to form a modified mesh, the modified mesh having a boundary that contains at least portions of the boundary defined by the input.

5. The computer-implemented method of claim 4, wherein the generating of the mesh of equilateral triangles further comprises:
   adding additional equilateral triangles to the boundary of the modified mesh to form a second modified mesh, the second modified mesh having a boundary that lies outside of the boundary of the input, wherein the second modified mesh comprises the mesh.

6. The computer-implemented method of claim 1, wherein the generating of the mesh of equilateral triangles comprises:
   generating the intersection curve located in a central region of the input, the intersection curve extending between first and second points on the boundary of the input;
   generating a first chain of equilateral triangles along a first side of the intersection curve;
   generating a second chain of equilateral triangles along a second side of the intersection curve;
   generating additional chains of equilateral triangles (i) between the first chain and the boundary of the input, and (ii) between the second chain and the boundary of the input, the chains being connected at common edges to form an initial mesh, wherein edges of triangles of the initial mesh are contained within the boundary of the input; and adding the additional equilateral triangles to the initial mesh to form a modified mesh, the modified mesh having a boundary that contains at least portions of the boundary of the input.

7. The computer-implemented method of claim 6, wherein the generating of the mesh of equilateral triangles further comprises:

adding additional equilateral triangles to the boundary of the modified mesh to form a second modified mesh, the second modified mesh having a boundary that lies outside of the boundary of the input, wherein the second modified mesh comprises the mesh.

8. The computer-implemented method of claim 7, wherein the one or more CAD surfaces define a closed surface, and the initial mesh comprises a first closed surface, the method further compromising:

generating equilateral triangles on the one or more CAD surfaces, wherein the equilateral triangles are generated on the first closed surface; and with a vertex of the initial closed surface, propagating a line on the equilateral triangles to generate a seam that is used to construct the 2D representation.

9. The computer-implemented method of claim 8, further comprising:

performing a projection procedure that identifies a cut of the seam in iterations of the projection procedure.

10. The computer-implemented method of claim 6, wherein each of the first and second chains include first and second ends, and wherein the generating of the mesh of equilateral triangles further comprises:

adding, at the first and second ends of the first chain, one or more additional equilateral triangles that extend across the boundary of the input; and adding, at the first and second ends of the second chain, one or more additional equilateral triangles that extend across the boundary of the input.

11. The computer-implemented method of claim 6, wherein the first and second chains have a length that corresponds to that of the intersection curve.

12. The computer-implemented method of claim 6, wherein each of the chains of equilateral triangles comprises a series of single equilateral triangles connected by common sides.

13. The computer-implemented method of claim 1, wherein the control mesh is composed of equilateral triangles.

14. The computer-implemented method of claim 1, wherein the local refinement is performed on the one or more regions of the control mesh and is not a global refinement of the entire control mesh.

15. The computer-implemented method of claim 1, wherein the mesh has a corresponding second limit surface $S^0$, and wherein the moving of the vertices of the mesh off of the input to generate the control mesh comprises an iterative process, the iterative process including:

for each vertex of the mesh:
(i) determining a distance $D^0$ between the vertex $V^0$ and its limit point $V_\infty^0$ on the limit surface $S^0$ via a first equation $$D^0 = V^0 - V_\infty^0,$$

(ii) adding the distance D0 to the vertex $V^0$ to determine a new vertex $V^1$ via a second equation $$V^1 = V^0 + D^0,$$

wherein a set of the new vertices is a mesh $M^1$, the mesh $M^1$ having a corresponding limit surface $S^1$, and wherein the steps (i) and (ii) are performed for each vertex $V^1$ of the mesh $M^1$.

16. The computer-implemented method of claim 1, wherein the limit surface of the control mesh has a C2 continuity, wherein the C2 continuity allows for a continuous first and second derivative.

17. The computer-implemented method of claim 1, wherein a large percentage of vertices of the control mesh are connected to exactly six (6) triangles.

18. The computer-implemented method of claim 1, wherein the input is data input.

19. The computer-implemented method of claim 1, wherein the moving means adjusting spatial coordinates of one or more vertices of the mesh.

20. The computer-implemented method of claim 1, wherein the limit surface passes through all of the vertices of the mesh.

21. A system for generating a surface that approximates one or more computer aided design (CAD) surfaces, the system comprising:

a processing system; and
computer-readable memory in communication with the processing system encoded with instructions for commanding the processing system to execute steps comprising:

receiving an input comprising a tessellation that approximates the one or more CAD surfaces via a plurality of triangles;

generating a mesh of equilateral triangles on the input along two sides of an intersection curve extending from first and second points on a boundary of the input, the mesh including vertices that lie on the plurality of triangles of the input, wherein the mesh is initially wholly contained within the boundary defined by the input and then subsequently, along each side of the intersection curve, one or more additional equilateral triangles are added to extend over the boundary defined by the input;

moving vertices of the mesh off of the input to generate a control mesh, the control mesh having a corresponding limit surface that passes through the vertices of the mesh, wherein after the moving, the control mesh forms an overhang outside the boundary defined by the input;

performing a local refinement on one or more regions of the control mesh, the one or more regions having an error metric value that is greater than a threshold value, the local refinement causing the limit surface of the control mesh to more closely approximate the one or more CAD surfaces; and generating a two-dimensional (2D) representation of the mesh based on parameterization of the mesh.

22. A non-transitory computer-readable storage medium for generating a surface that approximates one or more computer aided design (CAD) surfaces, the computer-readable storage medium comprising computer executable instructions which, when executed, cause a processing system to execute steps comprising:

receiving an input comprising a tessellation that approximates the one or more CAD surfaces via a plurality of triangles;

generating a mesh of equilateral triangles on the input along two sides of an intersection curve extending from first and second points on a boundary of the input, the mesh including vertices that lie on the plurality of triangles of the input, wherein the mesh is initially wholly contained within the boundary defined by the input and then subsequently, along each side of the intersection curve, one or more additional equilateral triangles are added to extend over the boundary defined by the input;

moving vertices of the mesh off of the input to generate a control mesh, the control mesh having a corresponding limit surface that passes through the vertices of the mesh, wherein, after the moving, the control mesh forms an overhang outside of the boundary defined by the input;

performing a local refinement on one or more regions of the control mesh, the one or more regions having an error metric value that is greater than a threshold value, the local refinement causing the limit surface of the control mesh to more closely approximate the one or more CAD surfaces; and generating a two-dimensional (2D) representation of the mesh based on parameterization of the mesh.

\* \* \* \* \*